United States Patent
Park et al.

(10) Patent No.: US 12,294,139 B2
(45) Date of Patent: May 6, 2025

(54) ELECTRONIC DEVICE INCLUDING ANTENNA

(71) Applicant: Samsung Electronics Co., Ltd., Gyeonggi-do (KR)

(72) Inventors: Kwangbok Park, Gyeonggi-do (KR); Hyungmock Kim, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 345 days.

(21) Appl. No.: 17/834,425

(22) Filed: Jun. 7, 2022

(65) Prior Publication Data
US 2023/0021614 A1 Jan. 26, 2023

Related U.S. Application Data

(63) Continuation of application No. PCT/KR2022/007988, filed on Jun. 7, 2022.

(30) Foreign Application Priority Data

Jul. 19, 2021 (KR) ........................ 10-2021-0094221

(51) Int. Cl.
*H01Q 1/22* (2006.01)
*H01Q 1/48* (2006.01)
*H01Q 1/52* (2006.01)

(52) U.S. Cl.
CPC ............. *H01Q 1/2266* (2013.01); *H01Q 1/48* (2013.01); *H01Q 1/526* (2013.01)

(58) Field of Classification Search
CPC ......... H01Q 1/2266; H01Q 1/48; H01Q 1/526
See application file for complete search history.

(56) References Cited

U.S. PATENT DOCUMENTS

| 9,122,446 B2 | 9/2015 | Jervis et al. |
| 9,941,574 B2 | 4/2018 | Hotta et al. |

(Continued)

FOREIGN PATENT DOCUMENTS

| CN | 105929896 | 8/2019 |
| CN | 211789507 | 10/2020 |

(Continued)

OTHER PUBLICATIONS

International Search Report dated Sep. 22, 2022 issued in counterpart application No. PCT/KR2022/007988, 8 pages.

(Continued)

*Primary Examiner* — Henry Luong
(74) *Attorney, Agent, or Firm* — The Farrelll Law Firm, P.C.

(57) ABSTRACT

An electronic device is provided, which includes a display unit included in a first housing; a second housing; and a hinge part configured to couple the first housing and the second housing. The display unit includes a first PCB; a first antenna pattern at least partially disposed at a first side surface of the first housing adjacent to the hinge part; a conductive member electrically connected to the first antenna pattern; and a first conductive plate electrically connected to at least a portion of the conductive member. The second housing includes a second conductive plate electrically connected to the first conductive plate; a third conductive plate electrically connected to the second conductive plate; and a second PCB at which a ground electrically connected to the third conductive plate is disposed.

18 Claims, 7 Drawing Sheets

(56) References Cited

U.S. PATENT DOCUMENTS

| | | | |
|---|---|---|---|
| 10,804,612 B2 | 10/2020 | Wu et al. | |
| 2012/0019429 A1 | 1/2012 | Chiu et al. | |
| 2014/0097993 A1 | 4/2014 | Hotta et al. | |
| 2014/0292613 A1 | 10/2014 | Hsiao et al. | |
| 2018/0366813 A1* | 12/2018 | Kim | ........................ H01Q 9/04 |
| 2020/0125138 A1 | 4/2020 | Lim et al. | |
| 2020/0183465 A1 | 6/2020 | Yoo et al. | |
| 2022/0069437 A1 | 3/2022 | Yoo et al. | |

FOREIGN PATENT DOCUMENTS

| | | | |
|---|---|---|---|
| JP | 2020-109549 | 7/2020 | |
| KR | 10-0596986 | 7/2006 | |
| KR | 20-0426917 | 9/2006 | |
| KR | 1020120014791 | 2/2012 | |
| KR | 1020200044394 | 4/2020 | |
| KR | 1020200068382 | 6/2020 | |
| KR | 1020200110061 | 9/2020 | |
| WO | WO 2014/057698 | 4/2014 | |
| WO | WO-2020085791 A1 * | 4/2020 | ............. H01Q 1/243 |

OTHER PUBLICATIONS

European Search Report dated Nov. 6, 2024 issued in counterpart application No. 22846038.2-1201, 4 pages.

* cited by examiner

ELECTRONIC DEVICE INCLUDING ANTENNA

CROSS-REFERENCE TO RELATED APPLICATIONS

This application is a Bypass Continuation Application of International Application No. PCT/KR2022/007988, which was filed on Jun. 7, 2022, and is based on and claims priority under 35 U.S.C. § 119 to Korean Patent Application No. 10-2021-0094221, which was filed in the Korean Intellectual Property Office filed on Jul. 19, 2021, the entire disclosure of each of which is incorporated herein by reference.

BACKGROUND

1. Field

The disclosure relates generally to an electronic device including an antenna, and more particularly, to an electronic device capable of securing a ground of an antenna pattern using a conductive member and shielding noise transferred from electronic components disposed around the antenna pattern.

2. Description of Related Art

The use of electronic devices such as foldable type smart phones, notebook computers, or tablet personal computers (PCs) is increasing, and various functions are provided through the electronic devices.

For example, an electronic device may transmit and receive various data to and from another electronic device through wireless communication.

The electronic device may provide services such as a global positioning system (GPS), Wi-Fi, long-term evolution (LTE), sub6, 5th generation (5G), near field communication (NFC), Bluetooth®, and/or magnetic secure transmission (MST) communication.

An electronic device may include at east one antenna (e.g., an antenna pattern) order to provide various services related to wireless communication. The antenna may be electrically connected to a controller (e.g., a processor or a wireless communication module) disposed on a printed circuit board (PCB), and transmit and receive wireless signals.

In the electronic device, when a housing (e.g., a side member) forming an external shape of the electronic device is made of a non-conductive material (e.g., a polymer), it may be difficult securely ground the antenna.

Further, when the antenna is disposed adjacent to a hinge part of a foldable electronic device and noise generated in a PCB of a display unit may be transferred to the antenna, which may deteriorate a radiation performance of the antenna.

When the ground of the antenna is not sufficiently secured and a radiation performance of the antenna is deteriorated, the electronic device may have difficulty in transmitting and receiving data to and from another electronic device.

SUMMARY

The disclosure has been made to address at least the above-mentioned problems and/or disadvantages and to provide at least the advantages described below.

An aspect of the disclosure is to provide an electronic device capable of securing a ground of an antenna pattern using a conductive member (e.g., conductive sheet or conductive plate) and shielding noise transferred from electronic components disposed near the antenna pattern.

In accordance with an aspect of the disclosure, an electronic device is provided, which includes a display unit included in a first housing; a second housing; and a hinge part configured to couple the first housing and the second housing. The first housing includes a first PCB; a first antenna pattern at least partially disposed at a first side surface of the first housing adjacent to the hinge part; a conductive member electrically connected to the first antenna pattern; and a first conductive plate electrically connected to at least a portion of the conductive member. The second housing includes a second conductive plate electrically connected to the first conductive plate; a third conductive plate electrically connected to the second conductive plate; and a second PCB at which a ground electrically connected to the third conductive plate is disposed.

In accordance with another aspect of the disclosure, an electronic device is provided, which includes a display unit included in a first housing; a second housing; and a hinge part configured to couple the first housing and the second housing. The first housing includes a first PCB; a first antenna pattern disposed at least partially on a first side surface of the first housing adjacent to the hinge part and a second antenna pattern disposed in area spaced apart from the first antenna pattern; a conductive member electrically connected to the first antenna pattern and the second antenna pattern; and a first conductive plate electrically connected to at least a portion of the conductive member. The second housing includes a second conductive plate electrically connected to the first conductive plate; a third conductive plate electrically connected to the second conductive plate; and a second PCB at which a ground electrically connected to the third conductive plate is disposed.

BRIEF DESCRIPTION OF THE DRAWINGS

The above and other aspects, features, and advantages of the disclosure will be more apparent from the following detailed description taken in conjunction with the accompanying drawings, in which.

DETAILED DESCRIPTION

Figure 1:
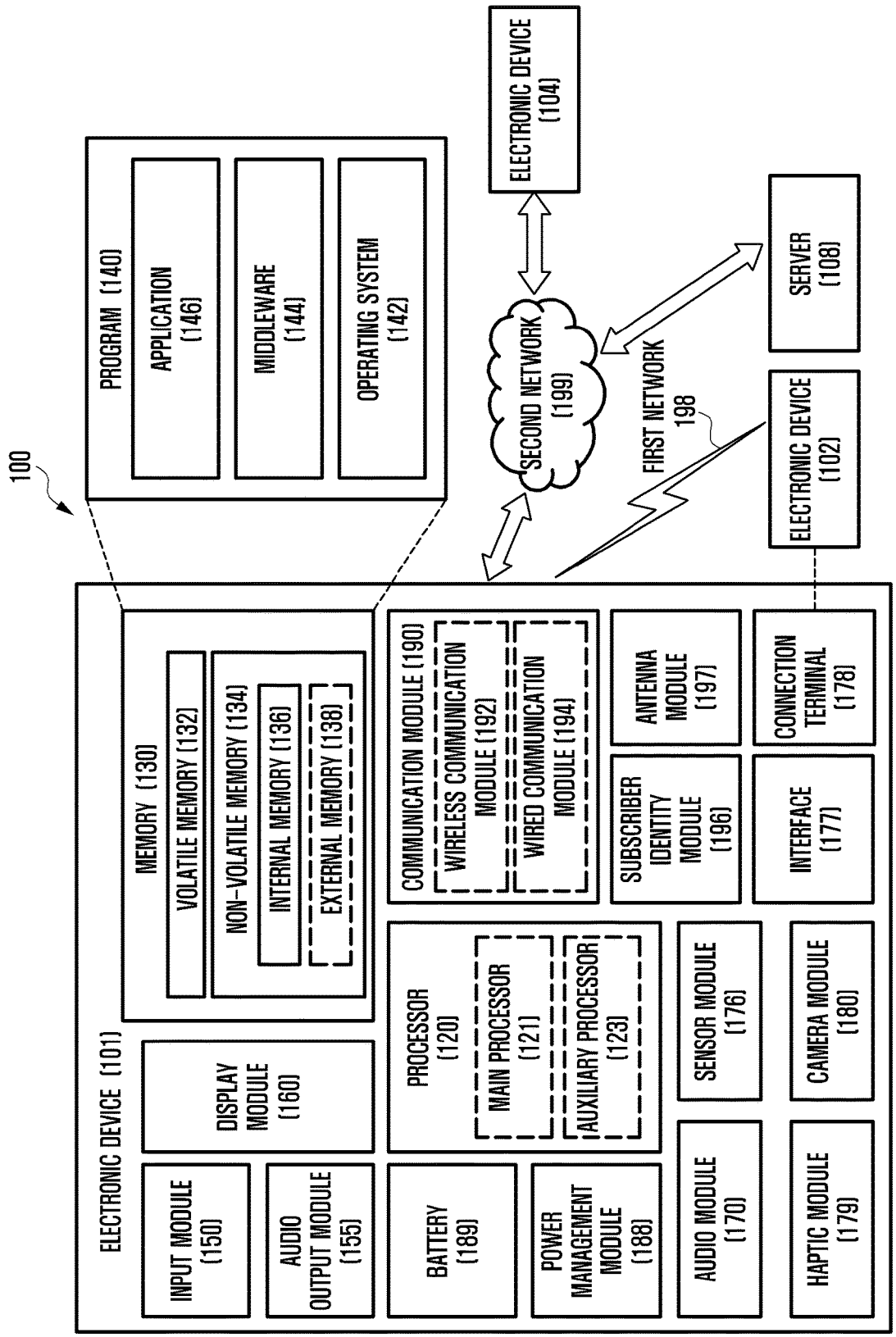
FIG. 1 illustrates an electronic device in a network environment according to an embodiment.

Hereinafter, various embodiments will be described in detail with reference to attached drawings. In the disclosure, embodiments are described in the drawings and a related detailed description is set forth, but this is not intended to limit the embodiments of the disclosure, Descriptions of well-known functions and constructions are omitted for the sake of clarity and conciseness.

FIG. 1 illustrates an electronic device in a network environment according to an embodiment.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123. According to an embodiment, the auxiliary processor 123 (e.g., the NPU) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent DNN (BRDNN), deep Q-network, or a combination of two or more thereof, but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth®, wireless-fidelity (Wi-Fi) direct, or IR data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a $4^{th}$ generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 1.64 dB or less) for implementing mMTC, or U-plane latency (e.g., 0.5 ms or less for each of downlink (DL) and uplink (UL), or a round trip of 1ns or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a PCB). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197

According to various embodiments, the antenna module 197 may form a mmWave antenna module. According to an embodiment, the mmWave antenna module may include a PCB, an RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or MEC. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Figure 2:
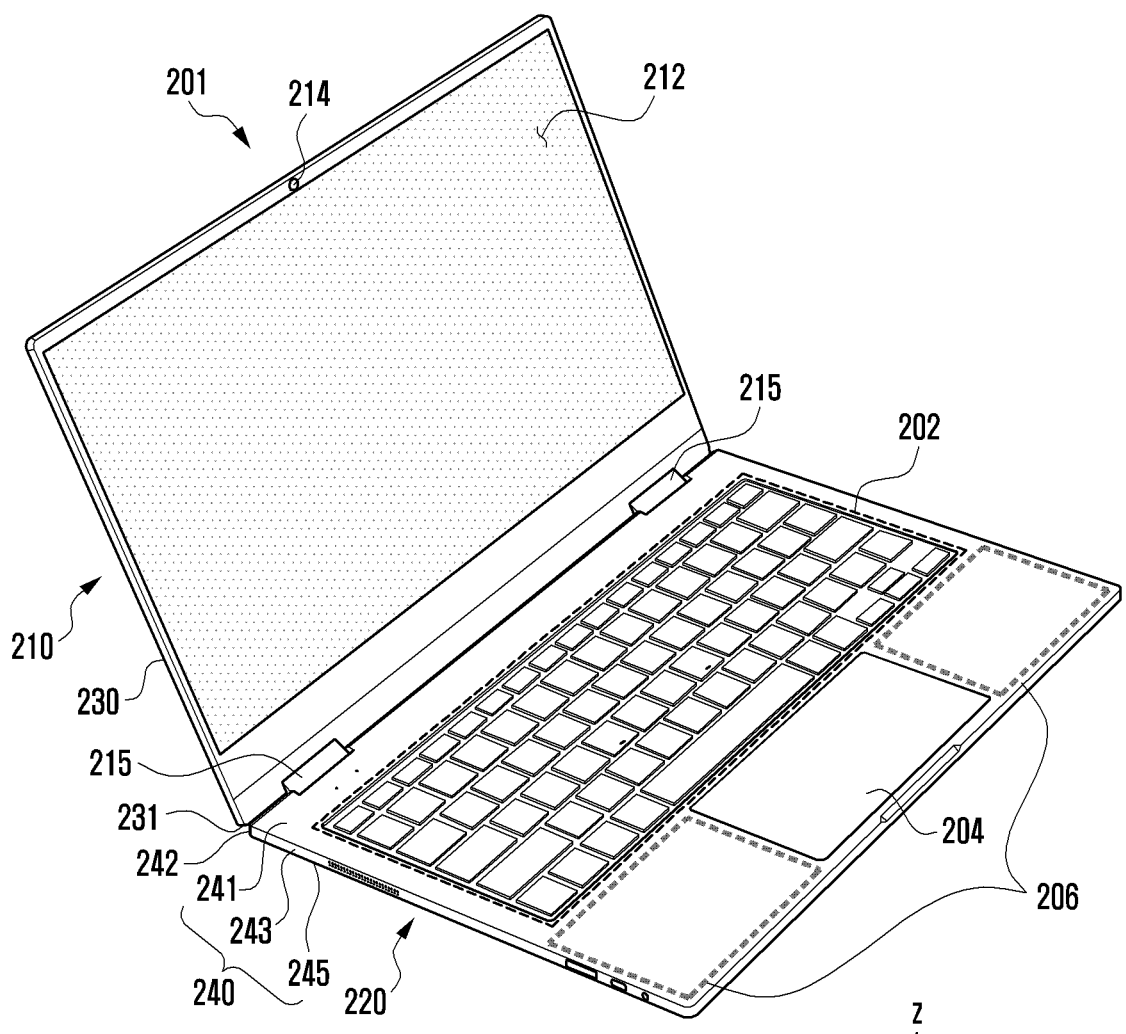
FIG. 2 illustrates an electronic device according to an embodiment.
Figure 2:
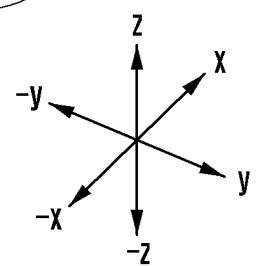

FIG. 2 illustrates an electronic device according to an embodiment.

Referring to FIG. 2, an electronic device 201 is a notebook computer. However, the disclosure is not limited thereto, and may be applied to various types of electronic devices including a hinge part such as a foldable type smart phone or a tablet PC.

The electronic device 201 includes a display unit 210, a hinge part 215, and a body part 220.

The display unit 210 includes a display 212, a first housing 230, and a camera module 214.

The display 212 may display various menus of the electronic device 201, information input by a user using a keyboard 202, and/or information to be provided to the user. The display 212 may include at least one of a liquid crystal display (LCD), an organic light emitted diode (OLED), an active matrix organic light emitted diode (AMOLED), a flexible display, or a transparent display. The display 212 may provide various screens, such as a home screen, a menu screen, a lock screen, a game screen, a web page screen, a call screen, or a music or video playback screen, etc., according to the use of the electronic device 201.

The first housing 230 forms an external shape of the display unit 210. The first housing 230 may be made of a conductive material (e.g., metal) and/or a non-conductive material (e.g., a polymer). The first housing 230 may protect the display 212 and/or the camera module 214 included in the display unit 210. The first housing 230 may protect a first PCB and other electronic components included inside the display unit 210.

The first housing 230 includes a first side surface 231 at a surface adjacent to a hinge part 215. The first side surface 231 may at least partially include a conductive material (e.g., metal).

The camera module 214 may capture a still picture and/or a moving picture. The camera module 214 may include one or more lenses, image sensors, ISPs, or flashes.

The hinge part 215 may couple the display unit 210 and a body part 220 to be foldable and/or unfoldable. The hinge part 215 may include a hinge module that mechanically connects the display unit 210 and the body part 220. The hinge part 215 may include at least a portion of at least one signal connection member (e.g., a flexible PCB (FPCB) or coaxial cable) that electrically connects the display unit 210 and the body part 220 therein. At least one hinge pan 215 may be included in the electronic device 201 so as to couple the display unit 210 and the body part 220 in a foldable fashion.

The body part 220 includes a keyboard 202, a touch pad 204, a palm rest 206, and a second housing 240. The body part 220 may also include a display.

The keyboard 202 may have a plurality of keys at an upper portion (e.g., in the z-axis direction) of the body part 220. The keyboard 202 may include a plurality of input keys and function keys for configuring various functions of the electronic device 201. The function keys may include a direction key, a volume key, and a shortcut key configured to perform a specific function. The keyboard 202 may include any one of a query keypad, a 3*4 keypad, a 4*3 keypad, or a touch key.

The touch pad 204 may replace a function of a mouse. The touch pad 204 may be used for inputting a command for selecting or executing various screens and/or applications displayed through the display unit 210.

The palm rest 206 may support as user hand to reduce wrist fatigue when using the keyboard 202.

The second housing 240 forms an external shape of the body part 220. The second housing 240 may be made of a conductive material (e.g., metal) and/or a non-conductive material (e.g., a polymer). The second housing 240 includes the palm rest 206 formed in the body part 220. The second housing 240 may protect a second PCB and/or a battery included inside the body part 220. In the second PCB, various electronic components may be disposed.

The second housing 240 includes a first surface 241 (e.g., an upper surface) disposed in a first direction (e.g., z-axis direction) of the body part 220, a second surface 245 (e.g., a lower surface) disposed in a second direction (e.g., −z-axis direction), winch is a direction opposite to that of the first surface 241, and a side surface 243 enclosing a space between the first surface 241 and the second surface 245.

The second housing 240 includes a second side surface 242 at a surface adjacent to the hinge part 215.

Figure 3:
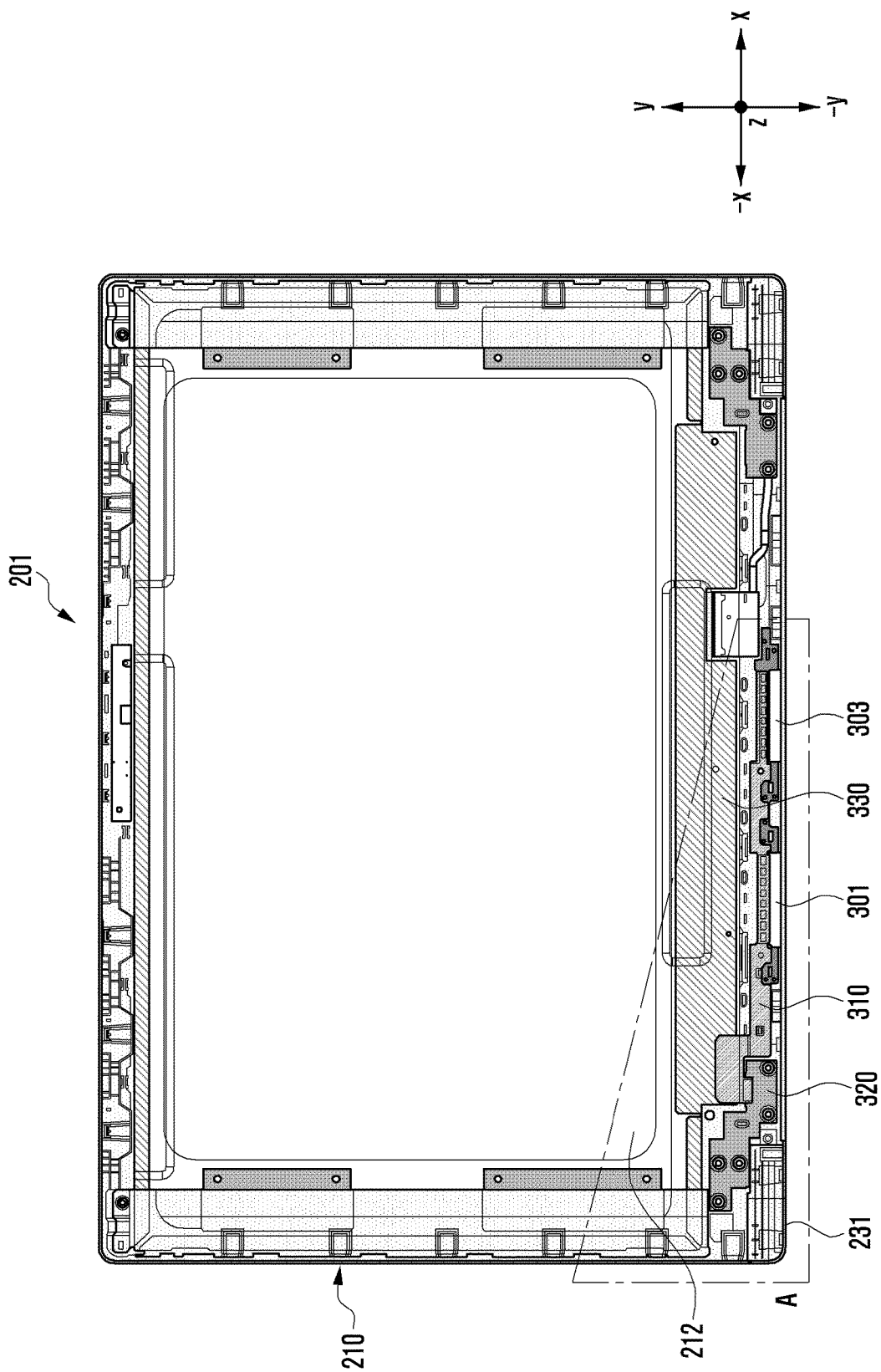
FIG. 3 illustrates the display unit of the electronic device of FIG. 2, according to an embodiment.

FIG. 3 illustrates the display unit of the electronic device of FIG. 2, according to an embodiment. Specifically, FIG. 3 illustrates the display unit 210 of the electronic device 201 viewed from one direction (e.g., y-axis direction).

Figure 4:
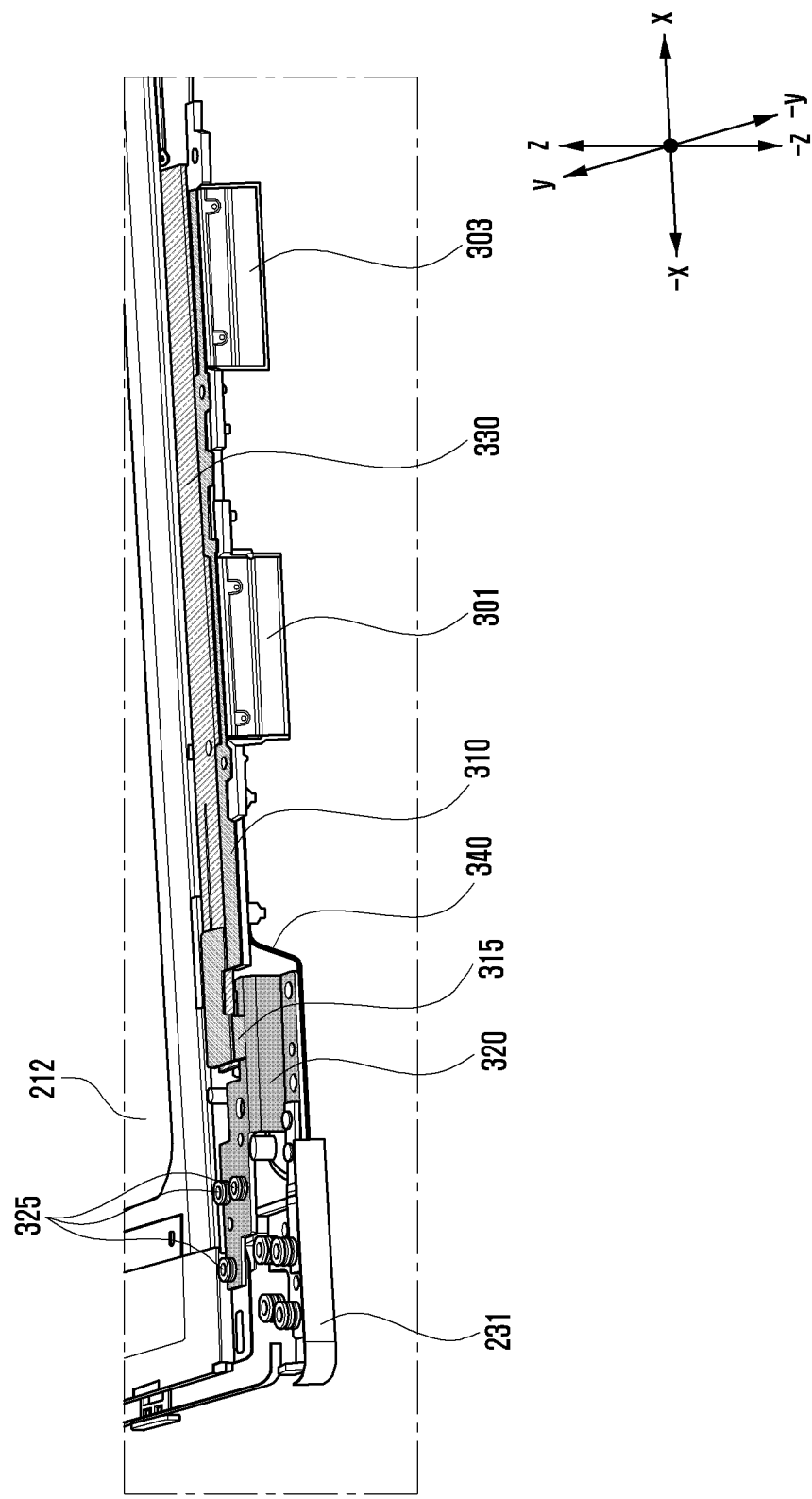
FIG. 4 illustrates a side surface of the portion A of the display unit illustrated in FIG. 3, according to an embodiment.

FIG. 4 illustrates a side surface of the portion A of the display avail illustrated in FIG. 3, according to an embodiment.

Referring to FIGS. 3 and 4, the display unit 210 of the electronic device 201 includes a first antenna pattern 301, a second antenna pattern 303, a conductive member 310, a first conductive plate 320, and a first PCB 330.

The first antenna pattern 301 may be at least partially disposed in the first housing 230 forming an external shape of the display unit 210. For example, the first antenna pattern 301 may be at least partially disposed at the fast side surface 231 of the first housing 230 adjacent to the hinge part 215.

The first antenna pattern 301 may be electrically connected to a processor and/or a wireless communication module, and may perform a function of the first antenna. The first antenna pattern 301 and/or the second antenna pattern 303 may operate in substantially the same or different frequency bands. For example, the first antenna pattern 301 may operate in a first Win frequency band (e.g., about 2.4 Ghz-2.5 Ghz or about 5 Ghz-6 Ghz), a GPS frequency band (e.g., about 1.5 Ghz-1.6 Ghz) and/or a Bluetooth® frequency band (e.g., about 2.4 Ghz-2.5 Ghz).

The second antenna pattern 303 may be at least partially disposed at the first side surface 231 of the first housing 230 adjacent to the hinge part 215. The second antenna pattern 303 may be disposed to be spaced apart from the first antenna pattern 301. The second antenna pattern 303 may be disposed in a first direction (e.g., x-axis direction) based on the first antenna pattern 301.

The second antenna pattern 303 may be electrically connected to a processor and/or a wireless communication module, and may perform a function of the second antenna. The second antenna pattern 303 may operate in a second WiFi frequency band (e.g., about 2.4 Ghz-2.5 Ghz or about 5 Ghz-6 Ghz), a GPS frequency band (e.g., about 1.5 Ghz-1.6 Ghz) and/or a Bluetooth® frequency band (e.g., about 2.4 Ghz-2.5 Ghz).

The first antenna pattern 301 may operate in a first WiFi frequency band (e.g., about 2.4 Ghz-2.5 Ghz), and the second antenna pattern 303 may operate in a second WiFi frequency band (e.g., about 5 Ghz-6 Ghz), or the first antenna pattern 301 may operate in the second WiFi frequency band, and the second antenna pattern 303 may operate in the first WiFi frequency band.

The first antenna pattern 301 and the second antenna pattern 303 may operate in the above described first and second Wi-Fi frequency hands, respectively (e.g., about 2.4 Ghz-2.5 Ghz or about 5 Ghz-6 Ghz), a GPS frequency band (e.g., about 1.5 Ghz-1.6 Ghz) and/or a Bluetooth® frequency band (e.g., about 2.4 Ghz-2.5 Ghz).

The frequency bands of each of the first antenna pattern 301 and the second antenna pattern 303 are not limited to the above-described examples, and the first antenna pattern 301 and the second antenna pattern 303 may operate in other various frequency bands (e.g., sub 6 and 5G).

Although the first antenna pattern 301 and the second antenna pattern 303 are illustrated in the embodiments of FIGS. 3 and 4, the electronic device 201 may alternatively include only one of the first antenna pattern 301 or the second antenna pattern 303, or more than two antenna patterns.

The first antenna pattern 301 and/or the second antenna pattern 303 may be electrically connected to a second PCB disposed in the body part 220 using a signal connection member 340 (e.g., a coaxial cable). The second PCB may include a processor and/or a wireless communication module.

As another example, when a processor and/or a wireless communication module are/is disposed on the fast PCB 330, the signal connection member 340 may be electrically connected to the first PCB 330.

The signal connection member 340 may include a first signal connection member and a second signal connection member.

The conductive member 310 may be electrically connected to the first antenna pattern 301 and/or the second antenna pattern 303. The conductive member 310 may include a conductive sheet or a conductive plate. At least a portion of the conductive member 310 may be electrically connected to the first antenna pattern 301. At least a portion of the conductive member 310 may be electrically connected to the second antenna pattern 303.

The first conductive plate 320 may be electrically connected to at least a portion of the conductive member 310. For example, the first conductive plate 320 may be electrically connected to the conductive member 310 using a contact part 315. The first conductive plate 320 may be disposed in a second direction (e.g., −x-axis direction) based on the first antenna pattern 301.

The first conductive plate 320 may be electrically connected to a second conductive plate and a third conductive plate disposed in the body part 220. The first conductive plate 320 may be coupled to at least a portion of the first housing 230 or the first side surface 231 of the display unit 210 using at least one screw 325.

The first conductive plate 320 may be electrically connected to the second conductive plate and the third conductive plate disposed in the body part 220. For example, the first conductive plate 320, the second conductive plate, and the third conductive plate may include stainless use steel (SUS).

The first PCB 330 may be disposed under the conductive member 310 (e.g., −z-axis direction). For example, the first PCB 330 may be disposed inside the first housing 230 rather than the conductive member 310. The first PCB 330 may include at least one electronic component and/or a connector for driving the display 212.

The conductive member 310 may be disposed between the first antenna pattern 301 and/or the second antenna pattern 303 and the first PCB 330. The first antenna pattern 301 and/or the second antenna pattern 303 may be positioned in a −y-axis direction of the conductive member 310, and the first PCB 330 may be positioned in a −z-axis direction of the conductive member 310. The conductive member 310 may be electrically connected (e.g., connected to the ground) to the first antenna pattern 301 and/or the second antenna pattern 303 and the first PCB 330. The conductive member 310 may shield noise and/or electromagnetic interference generated in the first PCB 330 from being transferred to the first antenna pattern 301 and/or the second antenna pattern 303.

Figure 5:
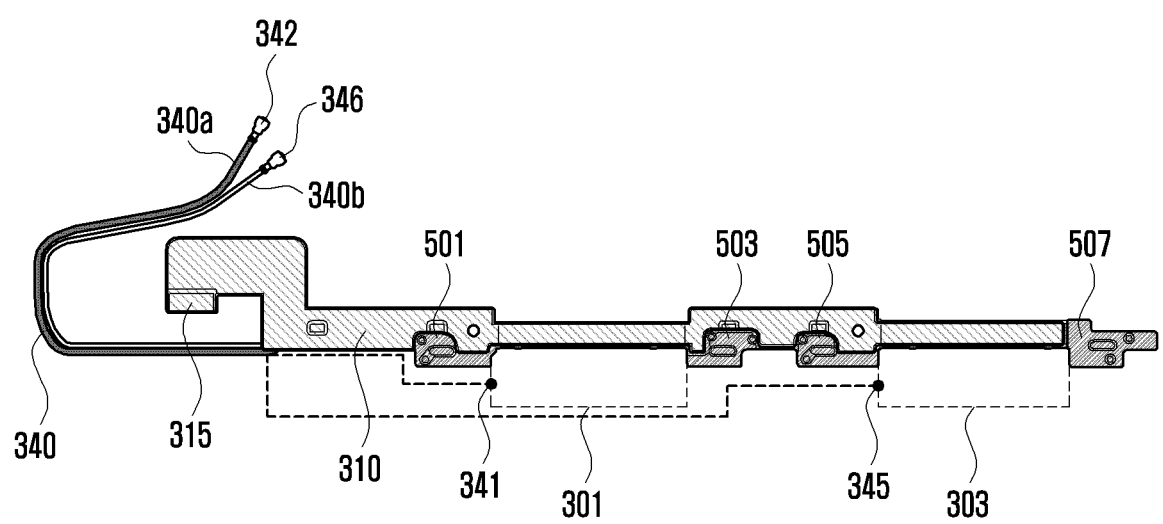
FIG. 5 illustrates a conductive member and a signal connection member according to an embodiment.

FIG. 5 illustrates a conductive member and a signal connection member according to an embodiment.

Referring to FIG. 5, the conductive member 310 may be coupled to the first antenna pattern 301 and/or the second antenna pattern 303 using a first fastening member 501, a second fastening member 503, a third fastening member 505, and/or a fourth fastening member 507.

The first fastening member 501, the second fastening member 503, the third fastening member 505, and the fourth fastening member 507 may be each coupled to the conductive member 310, and be spaced apart. The first fastening member 501, the second fastening member 503, the third fastening member 505, and/or the fourth fastening member 507 may be made of a non-conductive injection molding material. The first fastening member 501, the second fastening member 503, the third fastening, member 505, and/or the fourth fastening member 507 may be made of a non-conductive material (e.g., polymer). The first fastening member 501, the second fastening member 503, the third fastening member 505, and/or the fourth fastening member 507 may be attached to a support member (e.g., antenna carrier) in which the first antenna pattern 301 and/or the second antenna pattern 303 are/is formed and couple the conductive member 310 to the first antenna pattern 301 and/or the second antenna pattern 303.

The first antenna pattern 301 may be interposed between the first fastening member 501 and the second fastening member 503. The first antenna pattern 301 may be fixedly supported by the first fastening member 501 and the second fastening member 503. At least a portion of the first antenna pattern 301 may be electrically connected to the conductive member 310 using, e.g., a conductive tape. The first antenna pattern 301 may be electrically connected to at least a portion of the conductive member 310 using the first fastening member 501 and the second fastening member 503. The second antenna pattern 303 may be interposed between the third fastening member 505 and the fourth fastening member 507. The second antenna pattern 303 may be fixedly supported by the third fastening member 505 and/or the fourth fastening member 507. At least a portion of the second antenna pattern 303 may be electrically connected to the conductive member 310 using, e.g., a conductive tape. The second antenna pattern 303 may be electrically connected to at least a portion of the conductive member 310 using the third fastening member 505 and the fourth fastening member 507.

The first antenna pattern 301 and the second antenna pattern 303 may be electrically connected to a second PCB disposed in the body part 220 using the signal connection member 340 (e.g., a coaxial cable). The signal connection member 340 includes a first signal connection member 340a and a second signal connection member 340b. The first signal connection member 340a may include a first feeding line. The second signal connection member 340b may include a second feeding line. A first end 341 of the first signal connection member 340a may be electrically connected to the first antenna pattern 301. A second end 342 of the first signal connection member 340a may be electrically connected to the second PCB disposed in the body part 220. A first end 345 of the second signal connection member 340b may be electrically connected to the second antenna pattern 303. A second end 346 of the second signal connection member 340b may be electrically connected to the second PCB disposed in the body part 220.

Figure 6:
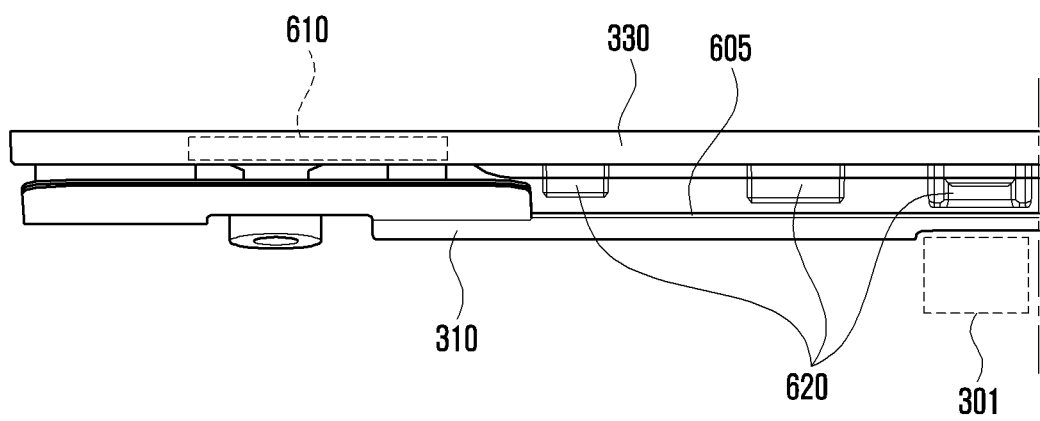
FIG. 6 illustrates a first antenna pattern, a conductive member, and a first PCB of an electronic device according to an embodiment.

FIG. 6 illustrates a first antenna pattern, a conductive member, and a first PCB of an electronic device according to an embodiment.

Referring to FIG. 6, a conductive member 310 is interposed between a first antenna pattern 301 (or the second antenna pattern 303) and a first PCB 330. The conductive member 310 may be electrically connected to the first antenna pattern 301 and the first PCB 330.

The first PCB 330 includes at least one electronic component 620 and a connector 610 for driving the display 212. The connector 610 and the at least one electronic component 620 may transfer noise to the first antenna pattern 301 or may cause electromagnetic interference. The at least one electronic component 620 may include a PMIC and/or a drive integrated circuit (IC).

The conductive, member 310 may shield noise and/or electromagnetic interference transferred from the first PCB 330 to the first antenna pattern 301. By shielding noise and/or electromagnetic interference transferred from the first PCB 330 to the first antenna pattern 301 using the conductive member 310, a radiation performance of the first antenna pattern 301 may be reduced from being deteriorated.

Alternatively, the conductive member 310 may be disposed in the support member 605 (e.g., antenna carrier). For example, the first fastening member 501, the second fastening member 503, the third fastening member 505 and/or the fourth fastening member 507 as illustrated in FIG. 5 may be coupled to the support member 605.

Figure 7:
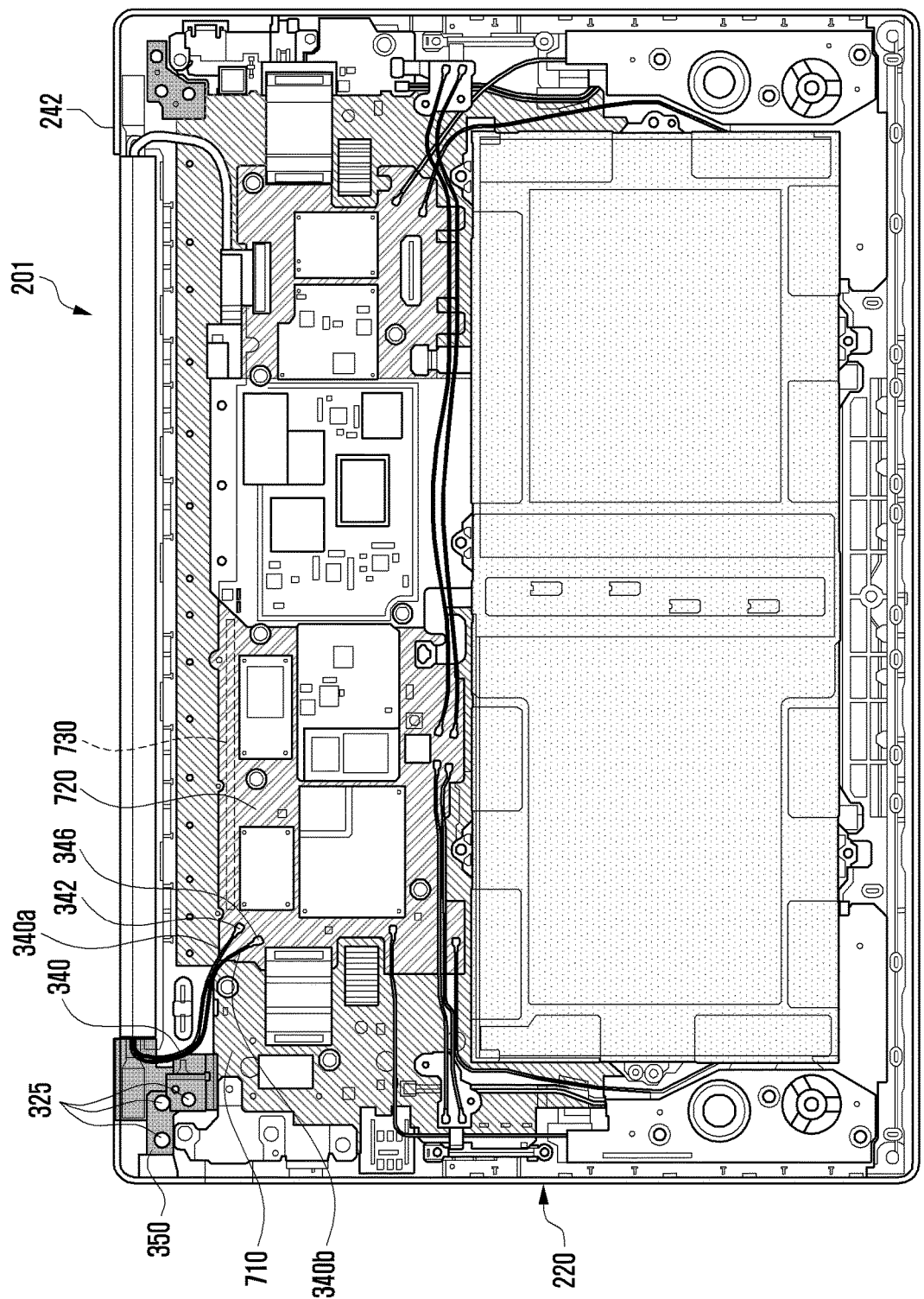
FIG. 7 illustrates an internal configuration of the body part of the electronic device of FIG. 2, according to an embodiment.

FIG. 7 illustrates an internal configuration of the body part of the electronic device of FIG. 2 according to an embodiment. Specifically, FIG. 7 illustrates the body part 220 of the electronic device 201 in FIG. 2 viewed from one direction (e.g., the z-axis direction).

Referring to FIG. 7, the body part 220 includes a second conductive plate 350, a third conductive plate 710, and a second PCB 720.

The second conductive plate 350 may be electrically connected to the first conductive plate 320 as illustrated in FIG. 3.

The third conductive plate 710 may be electrically connected to the second conductive plate 350, e.g., using at least one screw 325.

The third conductive plate 711 may be electrically connected to a ground 730 formed in the second PCB 720. For example, the ground 730 may be disposed in a layer of the second PCB 720, and a part thereof may be open to an outermost portion of the second PCB 720 to be electrically connected to the third conductive plate 710. The ground 730 may be formed using a conductive metal (e.g., copper foil).

The second PCB 720 may include a processor, a memory, a power management module, a communication module, an interface and/or a connection terminal for driving the electronic device 201. The processor and/or the communication module disposed in the second PCB 720 may be electrically connected to the first antenna pattern 301 and/or the second antenna pattern 303 disposed in the display unit 210 using the signal connection member 340 (e.g., coaxial cable).

Referring to FIGS. 3 and 7, the first antenna pattern 301 and/or the second antenna pattern 303 disposed at least partially at the first side surface 231 of the display unit 210 may be electrically connected to the first conductive plate 320 using the conductive member 310. The first conductive plate 320 may be electrically connected to the second conductive plate 350 and the third conductive plate 710 at least partially disposed adjacent to the second side surface 242 of the body part 220. The third conductive plate 710 may be electrically connected to the ground 730 disposed in the second PCB 720. Using the above-described configuration, the first antenna pattern 301 and the second antenna pattern 303 may secure a ground.

An electronic device according to an embodiment of the disclosure may include a display unit including a first housing; a body part including a second housing; and a hinge part configured to couple the display unit and the body part to be foldable and/or unfoldable, wherein the display unit may include a first PCB; a first antenna 301 at least partially disposed at a first side surface of the first housing adjacent to the hinge part; a conductive member electrically connected to the first antenna pattern and a first conductive plate electrically connected to at least a portion of the conductive member, wherein the body part may include a second conductive plate 350 electrically connected to the first conductive plate; a third conductive plate electrically connected to the second conductive plate, and a second PCB at which a ground electrically connected to the third conductive plate is disposed.

The electronic device may further include a second antenna pattern spaced apart from the first antenna pattern at the first side surface of the first housing, wherein the conductive member may be configured to be disposed between the second antenna pattern and the first PCB 330.

The first antenna pattern and/or the second antenna pattern may be configured to be electrically connected to the second PCB using a signal connection member.

The first antenna pattern and the second antenna pattern may be configured to operate in different frequency bands or substantially the same frequency band.

The first antenna pattern may be configured to operate in at least one frequency band of 2.4 Ghz-2.5 Ghz, 5 Ghz-6 Ghz, or 1.5 Ghz-1.6 Ghz, and the second antenna pattern may be configured to operate in at least one frequency hand of 2.4 Ghz-2.5 Ghz, 5 Ghz-6 Ghz, or 1.5 Ghz-1.6 Ghz.

The conductive member may lie disposed between the first antenna pattern and the first PCB.

The conductive member may be electrically connected to the first conductive plate using a contact part.

The second antenna pattern may be disposed spaced apart in a first direction of the first antenna pattern, and the first conductive plate may be disposed in a second direction of the first antenna pattern.

The conductive member may be configured to shield noise and/or electromagnetic interference generated in the first PCB from being transferred to the first antenna pattern.

The first antenna pattern may be configured to be coupled to at least a portion of the conductive member using a first fastening member and a second fastening member, and the second antenna pattern may be configured to be coupled to at least a portion of the conductive member using a third fastening member and a fourth fastening member.

According to an embodiment of the disclosure, an electronic device may include a display unit including a first housing; a body part including a second housing; and a hinge part configured to couple the display unit and the body part to be foldable and/or unfoldable, wherein the display unit may include a first PCB; a first antenna pattern disposed at least partially at a first side surface of the first housing adjacent to the hinge part and a second antenna pattern disposed spaced apart from the first antenna pattern; a conductive member electrically connected to the first antenna pattern and the second antenna pattern; and a first conductive plate electrically connected to at least a portion of the conductive member, wherein the body part may include a second conductive plate electrically connected to the first conductive plate; a third conductive plate electrically connected to the second conductive plate; and a second PCB in which a ground electrically connected to the third conductive plate is disposed.

The first antenna pattern and the second antenna pattern may be configured to be electrically connected to the second PCB using a signal connection member.

The first antenna pattern and the second antenna pattern may be constituted to operate in different frequency bands or in substantially the same frequency band.

The first antenna, pattern may be configured to operate in at least one frequency band of 2.4 Ghz-2.5 Ghz, 5 Ghz-6 Ghz, or 1.5 Ghz-1.6 Ghz, and the second antenna pattern may be configured to operate in at least one frequency band of 2.4 Ghz-2.5 Ghz, 5 Ghz-6 Ghz, or 1.5 Ghz-1.6 Ghz.

The conductive member may be disposed between the first antenna pattern and the second antenna pattern, and the first PCB.

The conductive member may be electrically connected to the first conductive plate using a contact part.

The second antenna pattern may be disposed in a first direction of the first antenna pattern, and the first conductive plate may be disposed in a second direction of the first antenna pattern.

The conductive member may be constituted to shield noise and/or electromagnetic interference generated in the fast PCB from being transferred to the first antenna pattern and the second antenna pattern.

The first antenna pattern may be coupled to at least a portion of the conductive member using a first fastening member and a second fastening member, and the second antenna pattern may be configured to be coupled to at least a portion of the conductive member using a third fastening member and a fourth fastening member.

The second conductive plate may be configured to be electrically connected to the third conductive plate using at least one screw.

According to the above-described embodiments, by securing a ground of an antenna pattern (e.g., conductive pattern) using a conductive member (e.g., conductive sheet or conductive plate), and shielding noise transferred from an electronic component (e.g., a PCB of the display unit) disposed around the antenna pattern, it is possible to reduce deterioration of a radiation performance of the antenna.

Although the disclosure has been described above according to various embodiments thereof, changes and modifications made by those of ordinary skill in the art to which the disclosure pertains without departing from the technical spirit of the disclosure also belong to the disclosure.

While the disclosure has been described with reference to various embodiments, various changes may be made without departing from the spirit and the scope of the disclosure, which is defined, not by the detailed description and embodiments, but by the appended claims and their equivalents.

What is claimed is:

1. An electronic device, comprising:
a display unit included in a first housing;
a second housing; and
a hinge part configured to couple the first housing and the second housing,
wherein the display unit comprises:
a first printed circuit board (PCB);
a first antenna pattern at least partially disposed at a first side surface of the first housing adjacent to the hinge part;
a conductive member electrically connected to the first antenna pattern; and
a first conductive plate electrically connected to at least a portion of the conductive member, and
wherein the second housing comprises:
a second conductive plate electrically connected to the first conductive plate;
a third conductive plate electrically connected to the second conductive plate; and
a second PCB at which a ground electrically connected to the third conductive plate is disposed, and
wherein the conductive member is configured to shield at least one of noise or electromagnetic interference generated in the first PCB from the first antenna pattern.

2. The electronic device of claim 1, further comprising a second antenna pattern disposed in area spaced apart from the first antenna pattern at the first side surface of the first housing,
wherein the conductive member is disposed between the second antenna pattern and the first PCB.

3. The electronic device of claim 2, wherein at least one of the first antenna pattern or the second antenna pattern is electrically connected to the second PCB using a signal connecting member.

4. The electronic device of claim 2, wherein the first antenna pattern and the second antenna pattern operate in different frequency bands or substantially the same frequency band.

5. The electronic device of claim 2, wherein the first antenna pattern operates in at least one frequency band of 2.4 Ghz-2.5 Ghz, 5 Ghz-6 Ghz, or 1.5 Ghz-1.6 Ghz, and
wherein the second antenna pattern operates in at least one frequency band of 2.4 Ghz-2.5 Ghz, 5 Ghz-6 Ghz, or 1.5 Ghz-1.6 Ghz.

6. The electronic device of claim 2, wherein the second antenna pattern is disposed in an area spaced apart in a first direction from the first antenna pattern, and
wherein the first conductive plate is disposed in a second direction of the first antenna pattern.

7. The electronic device of claim 2, wherein the first antenna pattern is coupled to at least a portion of the conductive member using a first fastening member and a second fastening member, and
wherein the second antenna pattern is coupled to at least a portion of the conductive member using a third fastening member and a fourth fastening member.

8. The electronic device of claim 1, wherein the conductive member is disposed between the first antenna pattern and the first PCB.

9. The electronic device of claim 1, wherein the conductive member is electrically connected to the first conductive plate using a contact part.

10. An electronic device, comprising:
a display unit included in a first housing;
a second housing; and
a hinge part configured to couple the first housing and the second housing,
wherein the display unit comprises:
a first printed circuit board (PCB);
a first antenna pattern disposed at least partially at a first side surface of the first housing adjacent to the hinge part;
a second antenna pattern disposed in area spaced apart from the first antenna pattern;
a conductive member electrically connected to the first antenna pattern and the second antenna pattern; and
a first conductive plate electrically connected to at least a portion of the conductive member, and
wherein the second housing comprises:
a second conductive plate electrically connected to the first conductive plate;
a third conductive plate electrically connected to the second conductive plate; and
a second PCB at which a ground electrically connected to the third conductive plate is disposed, and
wherein the conductive member is configured to shield at least one of noise or electromagnetic interference generated in the first PCB from the first antenna pattern.

11. The electronic device of claim 10, wherein the first antenna pattern and the second antenna pattern are electrically connected to the second PCB using a signal connecting member.

12. The electronic device of claim 10, wherein the first antenna pattern and the second antenna pattern are configured to operate in different frequency bands or substantially the same frequency band.

13. The electronic device of claim 10, wherein the first antenna pattern operates in at least one frequency band of 2.4 Ghz-2.5 Ghz, 5 Ghz-6 Ghz, or 1.5 Ghz-1.6 Ghz, and
wherein the second antenna pattern operates in at least one frequency band of 2.4 Ghz-2.5 Ghz, 5 Ghz-6 Ghz, or 1.5 Ghz-1.6 Ghz.

14. The electronic device of claim 10, wherein the conductive member is disposed between the first antenna pattern, the second antenna pattern, and the first PCB.

15. The electronic device of claim 10, wherein the conductive member is electrically connected to the first conductive plate using a contact part.

16. The electronic device of claim 10, wherein the second antenna pattern is disposed in a first direction from the first antenna pattern, and
wherein the first conductive plate is disposed in a second direction from the first antenna pattern.

17. The electronic device of claim 10, wherein the first antenna pattern is coupled to at least a portion of the conductive member using a first fastening member and a second fastening member, and wherein the second antenna pattern is coupled to at least a portion of the conductive member using a third fastening member and a fourth fastening member.

18. The electronic device of claim 10, wherein the second conductive plate is electrically connected to the third conductive plate using at least one screw.

* * * * *